United States Patent [19]
Walsh

[11] 3,857,123
[45] Dec. 31, 1974

[54] APPARATUS FOR WAXLESS POLISHING OF THIN WAFERS

[75] Inventor: Robert J. Walsh, Ballwin, Mo.

[73] Assignee: Monsanto Company, St. Louis, Mo.

[22] Filed: Oct. 27, 1972

[21] Appl. No.: 301,554

Related U.S. Application Data

[62] Division of Ser. No. 82,673, Oct. 21, 1970, abandoned.

[52] U.S. Cl. .................... 51/131
[51] Int. Cl. .................... B24b 7/00
[58] Field of Search .................... 51/131, 216, 283, 326, 51/327, 129; 156/17

[56] References Cited

UNITED STATES PATENTS

| | | | |
|---|---|---|---|
| 1,763,820 | 6/1930 | Rodemeyer | 51/327 |
| 2,998,680 | 9/1961 | Lipkins | 51/131 |
| 3,073,764 | 1/1963 | Sullivan | 51/131 UX |
| 3,342,652 | 9/1967 | Reisman | 51/131 UX |
| 3,449,870 | 6/1969 | Jensen | 51/216 R |
| 3,504,457 | 4/1970 | Jacobsen | 51/131 |
| 3,587,196 | 6/1971 | Dunn | 51/326 |
| 3,615,955 | 10/1971 | Regh | 51/131 UX |

*Primary Examiner*—Harold D. Whitehead
*Attorney, Agent, or Firm*—Peter S. Gilster; Harold R. Patton

[57] ABSTRACT

A process and apparatus for the waxless polishing of thin fragile wafers which includes positioning a wafer on a mounting pad having a coefficient of static friction with respect to the wafer such that the wafer may be moved into frictional engagement with a polishing surface without becoming disengaged from the mounting pad. The wafer and mounting pad are continuously rotated during polishing about a central axis normal to the plane of the wafer and such continuous rotation produces improved edge-rounding of the polished wafer.

4 Claims, 3 Drawing Figures

APPARATUS FOR WAXLESS POLISHING OF THIN WAFERS

This application is a division of application Ser. No. 82,673, filed Oct. 21, 1970, which is now abandoned.

FIELD OF THE INVENTION

This invention relates generally to a process and apparatus for polishing thin, fragile elements. More particularly, the invention is directed to an apparatus and process for polishing semiconductor or other similar wafers to a high degree of cleanliness, smoothness and surface perfection without requiring a wax or other similar substance for fixedly mounting the wafers during polishing.

BACKGROUND OF THE INVENTION

The desirability of providing highly polished surfaces for electronic grade semiconductor wafers is well known in the art. Surface defects such as crystal lattice damage, scratches, roughness or embedded particles of dirt or dust on semiconductor wafers tend to degrade the quality of semiconductor devices and integrated circuits fabricated within these wafers. Therefore, it is desirable to maximize the removal of these surface defects on semiconductor wafers prior to the device or integrated circuit fabrication therein.

DESCRIPTION OF THE PRIOR ART

Previously, it has been customary to simultaneously polish a plurality of semiconductor wafers after mounting these wafers on a carrier plate using a selected wax or other similar substance. After the wafers have been polished with a selected polishing pad and using suitable abrasive or chemical polishing agents, the wafers are demounted and further treated in a series of cleaning steps to remove dirt and wax residue contaminants from the surface prior to inspection and packaging. For example, in one prior art process, a plurality of these semiconductor wafers are fixedly mounted in wax on a rotatable disk and then polished by rotating the disk against a selected polishing material. Subsequently, the wafers are demounted from the rotatable disk by breaking the wax bond with a sharp instrument, and the residual wax is removed therefrom using suitable solvents. Further cleaning steps of (1) acid treatment, (2) water rinsing, (3) scrubbing with solvents, (4) scrubbing with water and (5) water rinsing were required to render the surfaces clean enough to permit critical inspection of wafer surface quality.

These multiple cleaning steps often resulted in damage to the wafers due to handling, and this damage decreased the yields of the overall wafer fabrication process. It should be remembered here that any damage to the wafers during the final polishing thereof is extremely costly, since the steps of crystal growth, grinding, sawing and lapping have already been successfully carried out prior to final polishing. Therefore, the wafers being finally treated during the polishing stages of the wafer fabrication process are expensive ones to lose as a result of damage due to handling.

An additional disadvantage associated with the wax mounting technique utilized for the polishing of wafers is that air bubbles in the wax are difficult to avoid. These bubbles prevent uniform support of the wafer by the wax and, as a result, the wafer deforms under the relatively high pressures used in production polishing and nonflat or wavy surfaces are produced.

SUMMARY OF THE INVENTION

The general purpose of this invention is to provide an improved apparatus and process for the waxless polishing of semiconductor or other similar wafers. The invention possesses many of the advantages of similarly employed prior art polishing apparatus and processes and further increases the semiconductor wafer yields over those attainable using known prior art polishing processes. To attain this, the present invention utilizes the frictional forces between a selected mounting pad and a semiconductor wafer to maintain the wafer in a fixed position on the mounting pad during wafer polishing. Predetermined frictional forces between the wafer and a wafer polishing pad may also be utilized to demount and free the wafer after the polishing has been completed. The above novel features of the present invention eliminate wax contamination from the polished wafers so that the number of cleaning and handling steps between final wafer polishing and wafer packaging are substantially reduced and process yields are increased accordingly. Additionally, each wafer is continuously rotated during polishing about a central axis normal to the wafer surface, and this rotation results in improved edge-rounding of the wafers as will be further described hereinafter.

An object of this invention is to provide a new and improved apparatus for polishing semiconductor wafers at high process yields.

Another object of this invention is to provide a new and improved apparatus of the type described herein for polishing semiconductor wafers to a high degree of smoothness, flatness and cleanliness.

Another object of this invention is to provide a new and improved apparatus of the type described which may be used to produce improved edge-rounding of the polished wafers.

A further object of this invention is to provide a new and improved apparatus of the type described characterized by faster polishing rates than those of known waxmounted wafer polishing processes.

A feature of this invention is the provision apparatus for carrying out of a new and improved wafer polishing process wherein the wafer being polished is continuously rotated about a central axis normal to the plane of the wafer to thereby produce uniform edge-rounding of the polished wafer.

Another feature of this invention is the provision apparatus for carrying out of a new and improved process of the type described wherein the mounting and demounting of the semiconductor wafers before and after wafer polishing is quickly and easily accomplished without the use of wax and other similar substance.

Another feature of this invention is the provision apparatus for carrying out of a new and improved process of the type described wherein the treatment and handling of the semiconductor wafers after final polishing are minimized and the repolishing of defective wafers is substantially reduced.

Briefly described, the present invention is embodied by a wafer polishing process and apparatus therefor wherein the wafer to be polished is positioned on a mounting pad between the pad and a polishing surface of a turntable. The static frictional forces between the mounting pad and the wafer are sufficient to maintain the wafer secure beneath the mounting pad during wafer polishing. A wafer positioning arm is rotatably mounted adjacent the turntable and further engages the mounting pad and a mounting disk therefor for applying pressure to and for selectively positioning the wafer on the surface of the turntable. While beneath the mounting disk and pad during polishing, the wafer may be freely moved and polished on the polishing surface of the turntable without becoming disengaged from the mounting pad. This feature is the result of the forces of static friction exerted on the wafer by the mounting pad being greater than the dynamic frictional forces exerted on the wafer by the polishing surface of the turntable.

When polishing has been completed in one embodiment of the invention and the wafer is brought to rest at a selected high friction portion of the polishing surface, the frictional forces which may now be exerted by the polishing surface of the turntable on the polished surface of the wafer are sufficient to demount and free the wafer from the mounting pad. This enables the polished wafer to be quickly and easily removed from the polishing surface of the turntable by a vacuum pickup device or the like. The polished wafer may now be rapidly washed and inspected before packaging without requiring either special instruments for demounting the wafer or the application of selected solvents for dewaxing or deoxidizing the wafer.

The above objects, features and brief decription of the invention will become more fully apparent in the following detailed description of the accompanying drawing.

DRAWING

DESCRIPTION OF THE PREFERRED EMBODIMENT

Figure 1:
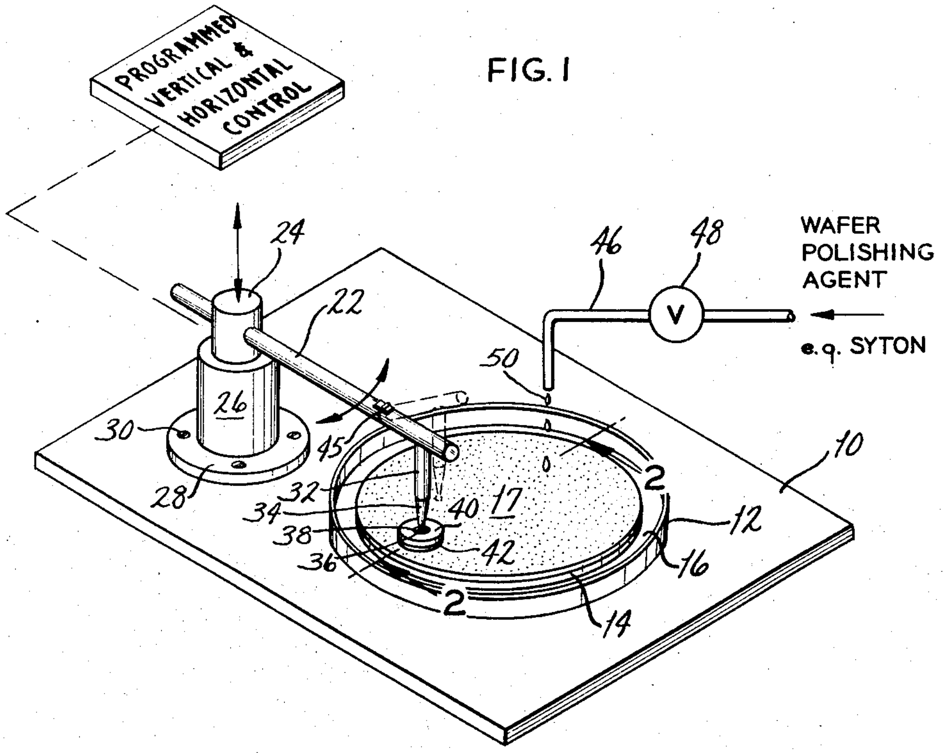
FIG. 1 illustrates the novel wafer polishing apparatus embodying the present invention. The apparatus in FIG. 1 utilizes a single polishing pad and is shown partially in isometric view and partially in schematic view.

Referring to FIG. 1, there is shown a turntable support member 10 which carries a cylindrical turntable housing or wall 12 within which a wafer polishing turntable 14 is rotatably mounted. The wafer polishing turntable 14 is spaced from the outer cylindrical protective wall 12 such that the opening 16 between the wall 12 and the edge of the turntable 14 permits a liquid polishing agent 50 to freely flow away from the turntable 14 during the rotation thereof.

The wafer polishing turntable 14 includes a single circular polishing pad 17 firmly secured thereto using a double faced pressure sensitive vinyl tape (not shown). The polishing pad 17 is preferably a poromeric material consisting of a fiber reinforced polyurethane foam. This poromeric material may, for example, be any of several types of polyester reinforced polyurethane foam sold by DuPont under the tradename "Corfam" or of Nylon reinforced polyurethane foam sold by the Clarino Corporation of America under the tradename "Clarino". For example, Corfam types 404-1002 Napped, 404-2029 Napped and Clarino types 1611 and 2611 have all been used successfully for pad 17 material in practicing this invention.

These poromeric materials have a two layer structure consisting of a substrate sheet comprised of fiber reinforced porous polyurethane coated on one surface with a thin layer of unreinforced microporous polyurethane. The coated side has a fine, suede-like appearance and is usually referred to as the "front" surface. The uncoated side of the substrate sheet has exposed reinforcing fibers, is rougher in texture and is usually referred to as the "reverse" or "substrate" surface of the material. This distinction is important since it has been found that the front surface exhibits high friction characteristics when wet, while under the same conditions the substrate surface exhibits low friction characteristics. It is important that the low friction or substrate surface of the poromeric material be used for polishing pads 17 and 18. The wafer mounting pad 42 and the high finish polishing pad 20 (FIG. 3) both to be described in detail hereinafter are also preferably either Corfam or Clarino but are mounted with the front surface (high friction surface) exposed.

A wafer positioning arm 22 is secured to a vertical shaft 24 which rotates within a protective sleeve 26. The sleeve 26 is securely mounted on the turntable support member 10 by screws 30, and screws 30 extend through a sleeve base member 28 which is integral with the sleeve 26. Any suitable programmed horizontal and vertical control means 31, such as a computer controlled servomotor, may be utilized to control the exact horizontal rotational position of the arm 22 as well as the vertical force that it exerts on a wafer mounting disk 40. The wafer can be moved back and forth over the polishing pad by means of arm 22 to equalize wear on the pad.

A vertical pin member 32 is integrally joined, as shown, to and near the end of the wafer positioning arm 22 and extends substantially normal to the polishing surface 17 of the turntable 14. Pin member 32 includes a metal sphere 36 on its lower end which is journaled in a Teflon bearing 38 in the center of the wafer mounting disk 40. In order for the wafer mounting disk 40 to be easily removed from and inserted for rotation on the turntable 14 during a wafer polishing operation, the wafer positioning arm 22 may be broken at the hinge 45 and raised to the dotted position shown in FIG. 1.

Figures 2, 3:
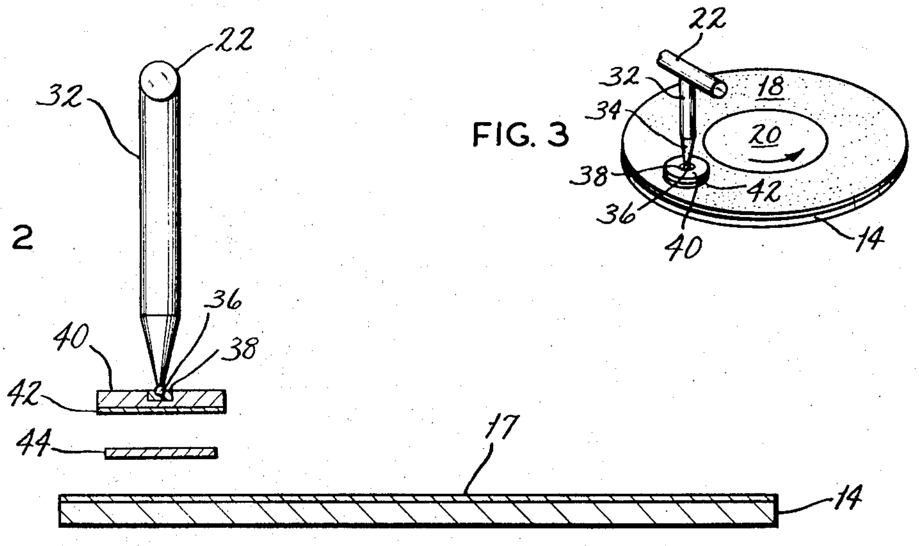
FIG. 2 is a cross-sectional view of the turntable assembly of FIG. 1 taken along lines 2—2 of FIG. 1.
FIG. 3 illustrates an alternative embodiment of the invention utilizing two polishing pads instead of one.

Referring to FIG. 2, a wafer mounting, i.e. wafer retention, pad 42 is adhesively secured to the lower surface of the mounting disk 40, and a wafer being polished rotates about its central axis and with the mounting pad 42 and disk 40 as the turntable 14 is rotated at a chosen angular velocity. The rotation of the disk 42 is caused by unbalanced frictional forces about the center of rotation of the wafer imparted by contact with the rotating turntable surface and consequently produces a smooth and flat polished wafer surface free from any hills or valleys which may otherwise be caused by roughness of the polishing surface 17. For example, if the turntable 14 is rotated in a counterclockwise direction as shown in the drawing, then the mounting disk 40 will likewise be rotated in counterclockwise direction as it turns around the spherical pivot 36.

As shown in FIG. 2, a semiconductor wafer 44 to be polished is slightly smaller in diameter than the mounting pad 42 upon which it rests. The wafer 44 is initially held in place on the mounting pad 44 by the surface tension between wafer 44 and pad 42, and such surface tension is provided by wetting the mounting pad 42 prior to wafer polishing. An operator will normally hold the mounting disk 40 with the mounting pad 42 thereon face up, place the wafer 44 on the mounting pad 42, and then turn the disk 40 over to the position shown in FIG. 1 where the wafer 44 will be held thereon by the above surface tension before coming to rest on the surface of the polishing pad 17.

Preferably, the mounting pad 42 is one of the poromeric materials previously described. It is adhesively mounted to the mounting disk 40 with the high friction front surface exposed for wafer mounting. In order to laterally move the wafer 44 when it is pressed against the mounting pad 42, a substantial lateral force is required to overcome the static frictional forces exerted by the mounting pad 42 on the wafer 44. In practicing the present invention, the mounting pads 42 actually preferred are Clarino corporation, of America's Clarino Type Nos. 1611 and 2611. However, DuPont's Corfam Type Nos. 404-1002 Napped, 404-2029 Napped or 404-1007 Napped may also be used for the mounting pad 42 material.

When the wafer 44 has been placed on the mounting pad 42 and positioned as shown in FIG. 2 between the mounting pad 42 and the polishing pad 17, the rotation of the turntable 14 is initiated by suitable motor drive means (not shown) and continues for a preselected polishing time determined by the polishing finish and stock removal requirements of the polishing process. As previously mentioned, the Corfam or Clarino substrate polishing pad 17 has a relatively low friction surface compared to that of the smooth front side of the Clarino mounting pad 42. As a result of this low friction surface of pad 17, neither the static nor the dynamic frictional forces exerted by the polishing pad 17 on the semiconductor wafer 44 can overcome the static frictional force exerted by high friction surface of the Clarino mounting pad 42 on the back surface of the wafer 44, i.e., it follows that the surface of pad 17 has coefficients of static and kinetic friction with respect to the wafer both of which are less than the coefficient of static friction of pad 42 with respect to the wafer. Therefore, the wafer 44 will not be moved from beneath the mounting pad 42 when turntable rotation is initiated and during wafer polishing.

A suitable vertical force is applied to the mounting disk 40 via the pin 32 of the wafer positioning arm 22. In this sense, mounting disk 40 constitutes a pressure disk since it presses the surface of wafer 44 against pad 17. The force used depends on the particular polishing agent and turntable speed employed. Since the mounting disk 40 continuously rotates about its central axis during polishing, the semiconductor wafer 44 is provided with a smooth and uniform edge rounding which is a desirable feature for certain polished wafer applications. This improved edge rounding characteristic is especially desirable when the polished semiconductor wafers are subsequently used for the growth of epitaxial layers thereon, since it has been observed that improved epitaxial layers can be grown on semiconductor wafers whose edges have been smoothly and uniformly rounded during the polishing process. When multiple wafers are mounted on a single mounting block and the block is rotated during polishing in accordance with a known prior art process, it has been observed that the polished wafers are not uniformly edge rounded during a polishing operation. This is a result of the edges of the wafers being polished to a greater extent when the mounting block is in one rotational position and to a lesser extent when the mounting block is in another rotational position.

When the wafer polishing with the pad 17 is completed, the rotation of the turntable 14 is terminated, and the mounting disk 40 is removed from the wafer surface so that the polished wafer 44 can be removed from the mounting pad 42 by a vacuum device or the like.

Referring now to FIG. 3, there is shown a modified form of the polishing surface wherein a first or outer polishing pad 18 of the same low-friction, poromeric substrate material as the polishing pad 17 is used and completely encircles a second or inner polishing pad 20 having a relatively high friction surface. The inner pad 20 is preferably Corfam as previously described, mounted so as to expose the front or high friction surface thereof. When the turntable 14 and its supported polishing pads 18 and 20 illustrated in FIG. 3 are used in place of the turntable apparatus 14,17 shown in FIG. 1, the wafer polishing is initiated with the mounting disk 40 resting on the surface of the outer or first polishing pad 18. Therefore, the semiconductor wafer 44 remains beneath the mounting pad 42 while being polished against this first polishing pad 18. With the turntable 14 rotating and polishing the semiconductor wafer 44 on this outer polishing pad 18, the mounting disk 40 and wafer 44 can now be smoothly transferred to the high friction inner or second polishing pad 20 while remaining in continuous frictional engagement with the surfaces of polishing pads 18 and 20. After the above transfer, the wafer 44 is polished on the radius of this inner circular polishing pad 20. Since the kinetic or dynamic frictional forces exerted by the polishing pad 20 on the polished surface of the wafer 44 are less than the static frictional forces exerted by the mounting pad 42 on the unpolished surface of the wafer 44, the semiconductor wafer 44 will remain secure beneath the mounting pad 42 during the polishing thereof by the second polishing pad 20, i.e., it follows that the coefficient of kinetic friction of the surface of pad 20 is less than the coefficient of static friction of pad 42 with respect to the wafer. Typically, total polishing times (from a rough lapped wafer surface until completion) on the first and second polishing pads 18 and 20, respectively, are approximately 5–10 minutes on the outer or first polishing pad 18, and 10–20 seconds on the inner or second polishing pad 20. This is normally followed by a 5 second water rinse to remove residual polishing agent before shutting off the machine. The smooth suede-like front surface of the second Corfam polishing pad 20 imparts a very smooth and highly polished finish to the semiconductor wafer 44 within this relatively short 10–20 second polishing period. In prior art wax mounted polishing systems, practical polishing times are typically much longer (30–60 minutes). The reason is that if too much pressure is used, the frictional heat generated in rubbing the wafers across the polishing pad may result in melting or softening of the mounting wax. This limitation does not exist in the present inventive polishing process.

When the polishing and rinsing of the semiconductor wafer 44 on the second polishing pad 20 is complete, the rotational force imparted to the turntable 14 is terminated and the rotation of both the mounting disk 40 and the turntable 14 will gradually come to rest. The semiconductor wafer 44 may remain beneath the poromeric mounting pad 42 until and after all rotation and polishing motion on the turntable 14 is complete. In order to free the wafer 44 from the mounting pad 42, it may be necessary to provide an impulse of rotational force to the turntable 14, and this impulse causes separate and opposing static frictional forces to be simultaneously imparted to the wafer 44 by both the high friction surface of the mounting pad 42 and the high friction front surface of the polishing pad 20. However, the coefficient of static friction between the polishing pad 20 and the polished surface of the semiconductor wafer 44 is slightly greater than the coefficient of static friction between the mounting pad 42 and the back surface of the semiconductor wafer 44. As a result of the latter, the semiconductor wafer 44 will move with the polishing pad 20 during the above impulse of rotational force to the turntable 14 and be removed from underneath the mounting pad 42. By momentarily energizing the turntable 14 by an impulse of current to the motor drive means therefor and causing the turntable 14 to rotate only a few degrees, the semiconductor wafer 44 will spin out from underneath the mounting pad 42 and will come to rest on one of the polishing surfaces of the turntable 14. From this location, the semiconductor wafer 44 can be easily retrieved with a vacuum pickup device and thereafter washed prior to final inspection. If the polished wafer passes this final inspection, it can be packaged for shipment to customers without undue delay.

Frequently, the polished semiconductor wafer 44 will disengage the face down surface of the mounting pad 42 just before the turntable 14 comes to rest as the wafer polishing is being completed. In this case, the dynamic frictional drag exerted on the polished surface of the wafer 44 by the pad 20 as it is approaching its rest position is sufficient to overcome the static frictional force exerted by the mounting pad 42 on the wafer 44. The specific point and time that the semiconductor wafer 44 disengages the mounting pad 42 will vary from wafer-to-wafer, but in both of the two types of mounting pad disengagement described above, the semiconductor wafer 44 is conveniently and easily removed from the mounting pad 42 after the polishing process has been completed. Thus, when the turntable in FIG. 3 is used, no special instrument is required to remove the semiconductor wafer 44 from the surface of the mounting pad 42.

During the wafer polishing process described above, a selected liquid polishing agent 43 is passed through a flow control valve 46 and line 48 and is generally applied in droplets as shown to the polishing surface of the turntable 14. A suitable liquid polishing agent, such as the well-known silica sol marketed by the present assignee, Monsanto Co., under the trade name Syton, may advantageously be used in the above polishing process. For any more detailed discussion of polishing semiconductor wafers with silica sols, such as Syton, reference may be made to the Walsh et al. U.S. Pat. No. 3,170,273 assigned to the present assignee Monsanto Co. A water rinsing step is used after the polishing with Syton has been completed, and water may be passed through the line 46 by the use of any suitable valve control.

The present invention may be practiced other than as specifically described above. For example, the polishing apparatus embodying the invention and illustrated in FIG. 1 may be modified in a variety of ways within the scope of the present invention. The vertical polishing forces exerted on the pin 32 and the disk 40 during wafer polishing need not necessarily be applied to the shaft 24, but may be applied by any suitable means to the end of the wafer positioning arm 22 above the mounting disk 40. The application of a vertical polishing force may be easily accomplished, for example, by mounting a suitable pressure applicator on the wafer positioning arm 22 between the hinge 45 and the end of the arm 22.

While the apparatus disclosed above in the preferred embodiment of the invention shows only one mounting disk 42, it is within the scope of this invention to simultaneously polish a plurality of wafers using a corresponding plurality of mounting disks. For example, a tripod type of pin can be used in place of the pin 32 described above, with a separate mounting disk rotatably mounted on each leg of the tripod and the true mounting disks mutually displaced 120° on the polishing surface of the turntable. In this manner, three wafers may be polished in a single polishing operation. Other suitable multiple pin assemblies can be used for polishing more than three wafers at a time. But, for best polishing results using either the tripod or the multiple pin assemblies mentioned above, the wafer mounting disks should be mounted for rotation, about a single common axis normal to the polishing surface while simultaneously rotating about their individual central axes of rotation.

It should also be understood that while the above description of a preferred embodiment of the invention frequently refers to semiconductor wafers, other types of wafers may also be polished within the scope of this invention. For example, refractory oxides and magnetic bubble materials may be cut into wafers and polished utilizing the present invention.

Furthermore, the mounting and polishing pads used in practicing this invention are not limited to the preferred poromeric materials described above. Other suitable high and low friction materials which will maintain the wafer in the respective positions during and after polishing as described and which will impart a desired highly polished finish to the wafers may be used within the scope of this invention.

I claim:

1. Apparatus for polishing a wafer, said apparatus comprising a polishing turntable including a polishing pad having first and second polishing surfaces, a rotatable, wafer pressure disk for pressing the surface of a wafer against either of said polishing surfaces, said pressure disk having a wafer retention pad for retaining a wafer beneath said pressure disk and in contact with either of said polishing surfaces during polishing of said wafer, means for causing rotation of said turntable to cause relative movement of said polishing surfaces with respect to the surface of said wafer when in contact with either of said polishing surfaces, means for positioning said pressure disk for initial contact of said wafer with said first polishing surface, and for repositioning said pressure disk for subsequent contact of said wafer with said second polishing surface without interrupting the contact of said wafer with said polishing pad, said first polishing surface being adapted to provide initial polishing of said wafer and having coefficients of static and kinetic friction with respect to said wafer both of which are less than the coefficient of static friction of said wafer retention pad with respect to said wafer, whereby said wafer is retained under said retention pad and in contact with said first polishing surface both prior to and during rotation of said turntable, said second polishing surface being adapted to provide finish polishing of said wafer and having a coefficient of kinetic friction with respect to said wafer which is less than the coefficient of static friction of said wafer retention pad with respect to said wafer but said second polishing surface having a coefficient of static friction with respect to said wafer which is greater than the coefficient of static friction of said wafer retention pad with respect to said wafer, whereby said wafer is retained under said retention pad and in contact with said polishing surface during polishing but is removed by frictional force from under said retention pad when said turntable is brought to rest.

2. Apparatus as set forth in claim 1 wherein said first polishing surface is constituted by a poromeric material comprising a layer of fiber reinforced polyurethane and said second polishing surface is constituted by poromeric material comprising a substrate layer of fiber reinforced polyurethane and a thin surface layer of unreinforced microporous polyurethane.

3. Apparatus as set forth in claim 2 wherein said retention pad is constituted by poromeric material comprising a substrate layer of fiber reinforced polyurethane and a thin surface layer of unreinforced microporous polyurethane.

4. Apparatus as set forth in claim 1 wherein said turntable is circular, said first and second polishing surfaces lying in a plane perpendicular to the axis of rotation of said turntable, said first and second polishing surfaces being concentric with respect to said axis, said first polishing surface encircling said second polishing surface, said polishing surfaces being contiguous, said pressure disk being circular and of smaller diameter than the radial width of either of said positioning means comprising an arm, pivot means at one end of said arm for pivotally maintaining said pressure disk in position against said polishing pad, said pivot means permitting rotation of said pressure disk about the center thereof, and said arm being adapted to swing about an axis displaced from the axis of rotation of said turntable for transferring said pressure disk and thereby said wafer from said first polishing surface to said second polishing surface.

* * * * *